(12) United States Patent
Coggan et al.

(10) Patent No.: US 7,638,206 B2
(45) Date of Patent: Dec. 29, 2009

(54) BIFUNCTIONAL COMPOUNDS AND OLED USING THE SAME

(75) Inventors: Jennifer A. Coggan, Cambridge (CA); Nan-Xing Hu, Oakville (CA); Hany Aziz, Oakville (CA); George Vamvounis, Halifax (CA)

(73) Assignee: LG Display Co., Ltd., Seoul (KR)

( * ) Notice: Subject to any disclaimer, the term of this patent is extended or adjusted under 35 U.S.C. 154(b) by 376 days.

(21) Appl. No.: 11/312,467

(22) Filed: Dec. 21, 2005

(65) Prior Publication Data

US 2007/0141390 A1 Jun. 21, 2007

(51) Int. Cl.
*H01L 51/54* (2006.01)
(52) U.S. Cl. ............... 428/690; 428/917; 313/504; 313/506
(58) Field of Classification Search ............ 313/504, 313/506; 257/E51.049
See application file for complete search history.

(56) References Cited

U.S. PATENT DOCUMENTS

| | | | |
|---|---|---|---|
| 3,172,862 A | 3/1965 | Gurnee et al. |
| 3,530,325 A | 9/1970 | Mehl et al. |
| 4,356,429 A | 10/1982 | Tang |
| 4,539,507 A | 9/1985 | VanSlyke et al. |
| 4,720,432 A | 1/1988 | VanSlyke et al. |
| 4,769,292 A | 9/1988 | Tang et al. |
| 4,885,211 A | 12/1989 | Tang et al. |
| 5,059,861 A | 10/1991 | Littman et al. |
| 5,141,671 A | 8/1992 | Bryan et al. |
| 5,150,006 A | 9/1992 | VanSlyke et al. |
| 5,151,629 A | 9/1992 | VanSlyke |
| 5,227,252 A | 7/1993 | Murayama et al. |
| 5,247,190 A | 9/1993 | Friend et al. |
| 5,276,381 A | 1/1994 | Wakimoto et al. |
| 5,409,783 A | 4/1995 | Tang et al. |
| 5,429,884 A | 7/1995 | Namiki et al. |
| 5,457,565 A | 10/1995 | Namiki et al. |
| 5,516,577 A | 5/1996 | Matsuura et al. |
| 5,593,788 A | 1/1997 | Shi et al. |
| 5,608,287 A | 3/1997 | Hung et al. |
| 5,610,903 A | 3/1997 | Crayford |
| 5,703,436 A | 12/1997 | Forrest et al. |
| 5,728,801 A | 3/1998 | Wu et al. |
| 5,739,635 A | 4/1998 | Wakimoto |

(Continued)

FOREIGN PATENT DOCUMENTS

JP     2003-261472     *  9/2003

(Continued)

OTHER PUBLICATIONS

Bernius et al., "Developmental Progress of Electroluminescent Polymeric Materials and Devices", SPIE Conference on Organic Light-Emitting Materials and Devices III, Denver, Colo., Jul. 1999, vol. 3797, p. 129-137.

*Primary Examiner*—Dawn Garrett
(74) *Attorney, Agent, or Firm*—McKenna Long & Aldridge LLP (57) ABSTRACT

This invention discloses a new class of bifunctional blue emitting materials for organic electroluminescent (EL) applications. These compounds contain two functionalities: an emission chromophore comprised of an anthryl group and an electron transport group. Employment of these compounds improves device efficiency and stability.

18 Claims, 3 Drawing Sheets

U.S. PATENT DOCUMENTS

| | | |
|---|---|---|
| 5,846,666 A | 12/1998 | Hu et al. |
| 5,891,587 A * | 4/1999 | Hu et al. .................... 428/690 |
| 5,925,472 A | 7/1999 | Hu et al. |
| 5,942,340 A | 8/1999 | Hu et al. |
| 6,057,048 A | 5/2000 | Hu et al. |
| 6,225,467 B1 | 5/2001 | Esteghamatian et al. |
| 6,229,012 B1 | 5/2001 | Hu et al. |
| 6,392,250 B1 | 5/2002 | Aziz et al. |
| 6,392,339 B1 | 5/2002 | Aziz et al. |
| 6,479,172 B2 * | 11/2002 | Hu et al. .................... 428/690 |
| 6,562,485 B2 * | 5/2003 | Hu et al. .................... 428/690 |
| 6,614,175 B2 | 9/2003 | Aziz et al. |
| 6,821,643 B1 | 11/2004 | Hu et al. |
| 2002/0180349 A1 | 12/2002 | Aziz et al. |
| 2003/0234609 A1 | 12/2003 | Aziz et al. |
| 2008/0194878 A1 * | 8/2008 | Nishiyama et al. ......... 564/322 |

FOREIGN PATENT DOCUMENTS

| | | | |
|---|---|---|---|
| JP | 2004-224766 | * | 8/2004 |
| WO | WO 2005/068413 | * | 7/2005 |

* cited by examiner

BIFUNCTIONAL COMPOUNDS AND OLED USING THE SAME

BACKGROUND OF THE INVENTION

1. Field of Invention

This invention is directed to a new class of bifunctional blue emitting materials for organic electroluminescent (EL) application.

2. Discussion of Related Art

It is desirable to have organic EL devices (OLED) provide uniform luminescence, saturated color especially in the blue regions of the visible spectrum, low driving voltages, and that maintains device efficiency.

A typical organic EL device can be comprised of a layer of an organic luminescent material conductively sandwiched between an anode, typically comprised of a transparent conductor, such as indium tin oxide, and a cathode, typically a low work function metal such as magnesium, calcium, aluminum, or the alloys thereof with other metals. The EL device functions on the principle that under an electric field, positive charges (holes) and negative charges (electrons) are respectively injected from the anode and cathode into the luminescent layer and undergo recombination to form excitonic states which subsequently emit light. A number of prior art organic EL devices have been prepared from a laminate of an organic luminescent material and electrodes of opposite polarity, which devices include a single crystal material, such as single crystal anthracene, as the luminescent substance as described, for example, in U.S. Pat. No. 3,530,325. However, these devices usually require excitation voltages on the order of 100 volts or greater.

In U.S. Pat. No. 4,539,507 there is disclosed an EL device formed of a conductive glass transparent anode, a hole transporting layer of 1,1-bis(4-p-tolylaminophenyl)cyclohexane, an electron transporting layer of 4,4'-bis(5,7-di-tert-pentyl-2-benzoxzolyl)stilben, and an indium cathode.

U.S. Pat. No. 4,720,432 discloses an organic EL device comprising a dual-layer hole injecting and transporting zone, one layer being comprised of porphyrinic compounds supporting hole injection and the other layer being comprised of aromatic tertiary amine compounds supporting hole transport.

U.S. Pat. No. 4,769,292 discloses an EL device employing a luminescent zone comprised of an organic host material capable of sustaining hole-electron recombination and a fluorescent dye material capable of emitting light in response to energy released by hole-electron recombination. A preferred host material is an aluminum complex of 8-hydroxyquinoline, namely tris(8-hydroxyquinolinate)aluminum.

For visual display applications, organic luminescent materials should provide a satisfactory color in the visible spectrum, normally with emission maxima at about 460, 550 and 630 nanometers for blue, green and red. These organic EL devices may comprise a light-emitting layer which is comprised of a host material doped with a guest fluorescent material that is responsible for color emission. For efficient downshifting of EL emission wavelength in the host-guest emitting layer, it may be desirable that the host material should fluorescence in the blue or shorter wavelength region.

In many conventional organic EL devices, the luminescent zone or layer is formed of a green-emitting luminophor of tris(8-hydroxyquinolinate)aluminum with certain fluorescent materials. U.S. Pat. No. 5,409,783 discloses a red-emitting organic EL device by doping the tris(8-hydroxyquinolinate) aluminum layer with a red fluorescent dye. However, upshifting of the tris(8-hydroxyquinolinate)aluminum emission to blue region is believed to be highly inefficient. Although there have been several disclosures describing blue-emitting organic EL devices, for example in U.S. Pat. Nos. 5,151,629 and 5,516,577, the disclosures of which are fully incorporated herein by reference, their performance characteristics still possess many disadvantages such as poor emission hue, high operation voltages, low luminance, and poor operation stability.

Additionally, while recent progress in organic EL research has elevated the potential of organic EL devices for widespread applications, the performance levels of a number of current available devices, especially with respect to blue emission, may still be below expectations. In a typical organic EL device containing three layers, with hole-transporting and emitting and electron-transporting properties, when voltage is applied, the holes migrate through the hole transporting material and loosely bond with the electrons at the interface with the electron transporting layer. When holes and electrons recombine they form excitons that are responsible for the emission of light. The location of the recombination zone depends on many factors such as the energy alignment of the layers and mobility of the holes and electrons. Because the carrier mobility of the holes in the hole transporting layer is usually greater than that of the electrons in the electron transporting layer, some percentage of the holes can leak up to the cathode if the electron transporting layer exhibits a matching highest occupied molecular orbital level. This phenomenon could dramatically decrease the efficiency of the device.

SUMMARY OF THE INVENTION

Accordingly, the present invention is directed to bifunctional compounds and OLED using the same that substantially obviate one or more of the problems due to limitations and disadvantages of the related art.

One advantage of the present invention is that it may provide an EL device with a luminescent region having a bifunctional material that may benefit the efficiency of the device.

Additional examples of features and advantages of the invention will be set forth in the description which follows, and in part will be apparent from the description.

To achieve these and other advantages and in accordance with an embodiment of the present invention, as embodied and broadly described, an organic electroluminescent device comprising an anode, a cathode, and a component of Formula I:

Formula I wherein at least one R1-R8 is an electron transport group and wherein the R1-R8 that are not an electron transport group are each a substituent independently selected from the group consisting of hydrogen, alkyl with, for example, from 1 to about 25 carbon atoms, an alicyclic alkyl group with, for example, from about 3 to about 15 carbon atoms, an alkoxy group with from 1 to about 25 carbon atoms, a dialkylamino group with from about 2 to about 25 carbon atoms, a halogen, a cyano group, methyl, ethyl, isopropyl, tert-butyl, cyclohexyl, 4-tert-butylcyclohexyl, methoxy, ethoxy, isopropoxy, tert-butoxy, dimethylamino, diethylamino, substituted or unsubstituted aryl, heteroaryl, phenyl, tolyl, naphthyl, anthryl, phenylanthryl, diphenylanthryl, biphenylyl, phenylvinyl, diphenylvinyl, chlorine.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to exemplary embodiments of the present invention, examples of which are illustrated in the accompanying drawings.

The present invention relates to a bifunctional organic EL material and EL devices using the same. Specifically, is has been found that combining an emission chromophore and an electron transport group in the same compound leads to improved results in the functioning of an EL device. Such combination may be accomplished by forming bifunctional spiro-anthracenes of general Formula I:

Formula I wherein at least one R1-R8 is an electron transport group and wherein the R1-R8 that are not an electron transport group are each a substituent independently selected from the group consisting of hydrogen, alkyl with, for example, from 1 to about 25 carbon atoms, an alicyclic alkyl group with, for example, from about 3 to about 15 carbon atoms, an alkoxy group with from 1 to about 25 carbon atoms, a dialkylamino group with from about 2 to about 25 carbon atoms, a halogen, a cyano group, methyl, ethyl, isopropyl, tert-butyl, cyclohexyl, 4-tert-butylcyclohexyl, methoxy, ethoxy, isopropoxy, tert-butoxy, dimethylamino, diethylamino, substituted or unsubstituted aryl, heteroaryl, phenyl, tolyl, naphthyl, anthryl, phenylanthryl, diphenylanthryl, biphenylyl, phenylvinyl, diphenylvinyl, chlorine.

It is within the scope of the present invention to utilize any electron transport group that will combine with the spiro-anthracene. Exemplary electron transport groups are fluorine compounds such as fluorophenyl or perfluorinated aromatics. Other electron transport groups may also be employed such as: triazine, oxadiazole, triazole, imidazole, oxazole, thiazole, thiadiazole, benzothiadiazole, pyridine, quinoline, quinoxaline, anthrazoline, phenanthroline, imidazole, pyrazole, and indane.

The following is an illustrative list of possible compounds that fall within the scope of the present invention:

-continued

The bifunctional compound of Formula I according to the present disclosure may be synthesized by introduction of one or more fluorine molecules into a spiro-biphenylanthracene blue emitter. A method to synthesize such compound may be, for example:

As shown above, this exemplary compound (Compound A) was synthesized in an eight step convergent synthesis. The final compound was then purified by sublimation. The resulting compound shows a strong fluorescence emission in the blue region. It was also found that the obtained compound has a melting point of 448° C.

In another exemplary embodiment, a bifunctional compound (Compound B) of Formula I according to the present invention may also be synthesized by utilizing a six step synthesis and illustrated in the flow diagram below:

-continued

These, however, are exemplary synthesis processes. It is to be understood and additional synthesis processes that result in a bifunctional compound according to Formula I also fall within the scope of the present invention.

Figure 1:
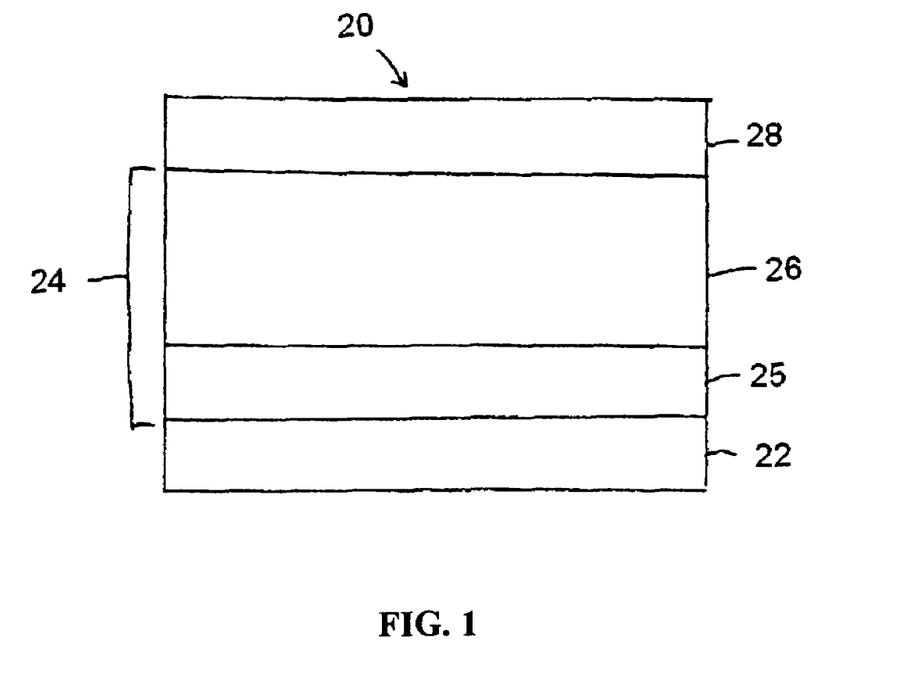
FIG. 1 to FIG. 3 show exemplary embodiments of an OLED structure according to the present invention.

A first exemplary embodiment of an organic electroluminescent device according to the present invention is shown in FIG. 1. In FIG. 1, an OLED 20 comprises a first electrode 22, a luminescent region 24, and a second electrode 28. Luminescent region 24 may comprise light-emitting layer 25 and charge transport layer 26. In one embodiment, the first electrode can be the cathode, while the second electrode can be the anode. In an alternative embodiment, the first electrode can be the anode, while the second electrode can be the cathode. When the second electrode is an anode, the charge transport layer 26 can be a hole transporting layer comprising a compound of Formula I. Alternatively, when the second electrode is a cathode, the charge transport layer 26 can be an electron transporting layer and layer 25 may comprise a hole transporting material and/or a light-emitting material comprising a compound of Formula I.

Figure 2:
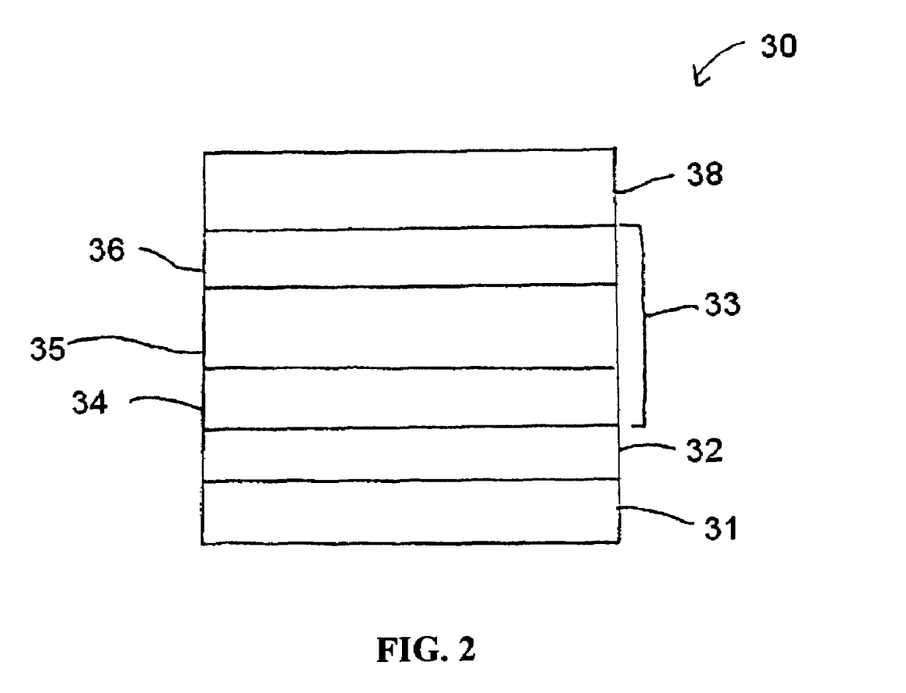
Figure 3:
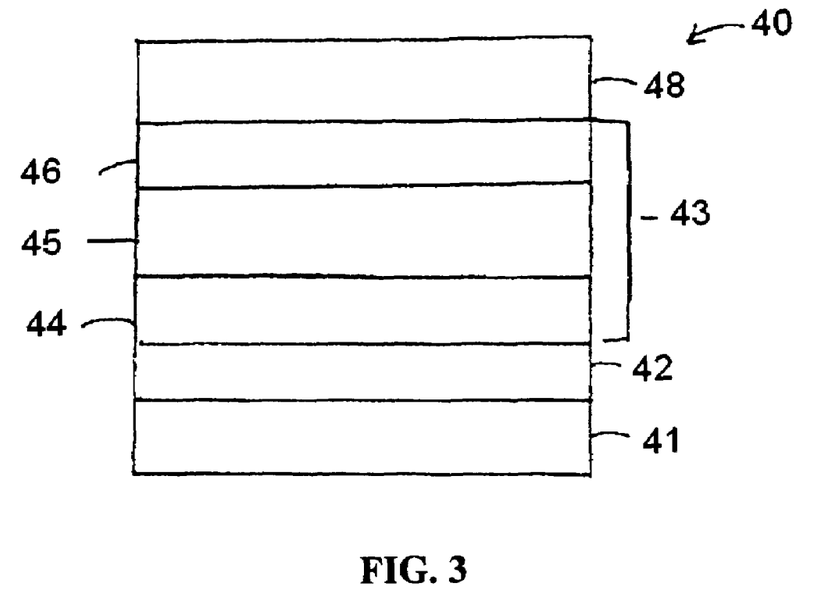

A third exemplary embodiment of an organic electroluminescent device is depicted in FIG. 2. In FIG. 2, an OLED 30 comprises an anode 31, an optional buffer layer 32, a luminescent region 33, and a cathode 38. Luminescent region 33 may comprise a hole transport layer 34, a light-emitting layer 35, and an electron transport layer 36. Light-emitting layer 35 and/or hole transporting layer 34 may comprise a compound of Formula I. With reference to FIG. 3, display device 40, such as, for example, an OLED, comprises a first electrode 41, an optional buffer layer 42, a luminescent region 43, and a second electrode 48. Luminescent region 43 may comprise a first charge transport layer or zone 44, a light-emitting layer 45, and a second charge transport zone 46. The light-emitting layer 45 may comprise a light-emitting material with a compound of the Formula I. The first electrode can be either an anode or a cathode, and the second electrode can be either a cathode or an anode. Additionally, the first charge transport zone can be either a hole transport zone when the first electrode is an anode (the second charge transport zone being an electron transport zone) or an electron transport when the first electrode is a cathode (the second charge transport zone being a hole transport zone). The hole transporting zone may comprise a compound of Formula I.

It will be appreciated that the organic electroluminescent devices depicted in FIGS. 1-3 may further comprises a substrate positioned at any suitable location in the depicted OLED. For example, the respective devices may include a substrate in contact with either the first or second electrode, i.e., with either the anode or the cathode.

It will also be appreciated that each layer of an organic electroluminescent device may comprise a single layer or two, three, four or more layers. For purposes of the present disclosure, adjacent layers are considered separate if the composition of the layers differs in at least one of i) the concentrations of the components in the layers and/or ii) the components making up the compositions of the respective layers. For example, adjacent layers having compositions comprising the same components but at different concentrations are considered separate layers. The term "region" refers to a single layer, a plurality of layers such as two, three, or more layers, and/or one or more zones. The term "zone" refers to a single layer, a plurality of layers, a single functional area in a layer, or a plurality of functional areas in a layer.

The luminescent region of an organic electroluminescent device according to the present invention, including, for example, a hole transporting layer, may comprise a hole transporting compound of Formula I Formula I wherein at least one R1-R8 is an electron transport group and wherein the R1-R8 that are not an electron transport group are each a substituent independently selected from the group consisting of hydrogen, alkyl with, for example, from 1 to about 25 carbon atoms, an alicyclic alkyl group with, for example, from about 3 to about 15 carbon atoms, an alkoxy group with from 1 to about 25 carbon atoms, a dialkylamino group with from about 2 to about 25 carbon atoms, a halogen, a cyano group, methyl, ethyl, isopropyl, tert-butyl, cyclohexyl, 4-tert-butylcyclohexyl, methoxy, ethoxy, isopropoxy, tert-butoxy, dimethylamino, diethylamino, substituted or unsubstituted aryl, heteroaryl, phenyl, tolyl, naphthyl, anthryl, phenylanthryl, diphenylanthryl, biphenylyl, phenylvinyl, diphenylvinyl, chlorine.

The layers of an OLED may be transparent or opaque depending on the side of the OLED that is facing the viewer. Illustrative materials for the various potential layers of an OLED will now be discussed in constructing OLEDs in according to exemplary embodiments of the present invention.

Materials suitable for the optional substrate include, for example, polymeric components, glass, quartz and the like. Suitable polymeric components include, but are not limited to polyesters such as MYLAR™, polycarbonates, polyacrylates, polymethacrylates, polysulfones, and the like. Other substrate materials can also be selected provided, for example, that the materials can effectively support the other layers, and do not interfere with the device functional performance.

In an exemplary embodiment, the substrate may be opaque. An opaque substrate can comprise various suitable materials including, for example, polymeric components like polyesters such as MYLAR™, polycarbonates, polyacrylates, polymethacrylates, polysulfones, and the like, which contain coloring agents or dyes such as carbon black. The substrate can also be comprised of silicon such as amorphous silicon, polycrystalline silicon, single crystal silicon, and the like. Another class of materials that can be used in the substrate are ceramics such as metallic compounds like metal oxides, halides, hydroxides, sulfides and others.

The substrate may have a thickness ranging from about 10 to about 5,000 micrometers. In some exemplary embodiments, the substrate may have a thickness of from about 25 to about 1,000 micrometers.

An anode can comprise suitable positive charge injecting materials such as indium tin oxide (ITO), silicon, tin oxide, and metals with a work function ranging from about 4 eV to about 6 eV such as gold, platinum, and palladium. Other suitable materials for the anode include, but are not limited to, electrically conductive carbon, 1 T conjugated polymers such as polyaniline, polythiophene, polypyrrole, and the like having, for example, a work function equal to, or greater than, about 4 eV and, in embodiments, a work function of 4 eV to about 6 eV. A substantially transparent anode can comprise, for example, indium tin oxide (ITO), very thin substantially transparent metallic layers, comprising a metal with a work function ranging from about 4 eV to about 6 eV such as gold, palladium and the like, having a thickness, for example, from about 10 A to about 200 A, and, particularly, from about 30 A to about 100 A. Additional suitable forms of the anode are disclosed in U.S. Pat. Nos. 4,885,211 and 5,703,436, which are incorporated herein by reference in their entirety. An anode can also comprise a metal-organic mixed layer (MOML) as disclosed in U.S. patent application Ser. No. 10/117,812, which is published as U.S. patent application Publication No. 2002/0180349 and is incorporated herein by reference in its entirety.

The thickness of the anode can range from about 10 A to about 50,000 A, with the preferred range depending on the electrical and optical constants of the anode material. One illustrative range of anode thickness is from about 300 A to about 3,000 A. Of course, a thickness outside of this range can also be used.

A cathode can comprise suitable electron injecting materials, such as metals, including high work function components, such as metals with, for example, a work function from about 4 eV to about 6 eV, or low work function components, such as metals with, for example, a work function of from about 2 eV to about 4 eV. The cathode can comprise a combination of a low work function (less than about 4 eV) metal and at least one other metal. Effective proportions of the low work function metal to the second or other metal are from less than about 0.1 weight percent to about 99.9 weight percent. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are preferred low work function metals. Exemplary cathode materials include the Mg—Ag alloy cathodes described in U.S. Pat. Nos. 4,885, 211; 4,720,432; and, 5,703,436, the disclosures of which are totally incorporated herein by reference. Cathodes may also comprise a metal-organic mixed later (MOML) as disclosed in U.S. patent application Ser. No. 10/117,812, which is incorporated herein by reference in its entirety, and in U.S. Pat. No. 5,429,884, the disclosure of which is totally incorporated herein by reference. The cathodes can also be formed from lithium alloys with other high work function metals such as aluminum and indium.

A substantially transparent cathode can comprise very thin substantially transparent metallic layers comprising a metal with a work function ranging from about 2 eV to about 4 eV, such as, for example, Mg, Ag, At, Ca, In, Li and their alloys. Examples of suitable metals include Mg:Ag alloys, comprised of, for example, from about 80 to 95 volume percent of Mg and about 20 to about 5 volume percent of Ag, and Li:Al alloys, comprised of, for example, from about 90 to 99 volume percent of Al, and from about 10 to about 1 volume percent of Li, and the like, having a thickness, for example, from about 10 A to about 50,000 A, and, particularly, from about 30 A to about 100 A. Of course, a thickness outside of this range can also be used.

The anode and cathode used in the present OLEDs each may be a single layer or may comprise two, three or more layers. For instance, the electrode may be composed of a charge injection layer (i.e., an electron injection layer or a hole injection layer) and a capping layer. In some exemplary embodiments, the charge injection layer may be considered distinct from the electrode.

The cathode can also include very thin substantially transparent metallic layers, composed of a metal with a work function ranging from about 2 eV to about 4 eV, such as Mg, Ag, Al, Ca, In, Li and their alloys such as Mg:Ag alloys composed of, for example, from about 80 to 95 volume percent of Mg and about 20 to about 5 volume percent of Ag, and Li:Al alloys, composed of, for example, from about 90 to 99 volume percent of Al, and from about 10 to about 1 volume percent of Li, and the like, having a thickness, for example, from about 10 A to about 200 A, and, particularly, from about 30 A to about 100 A. Of course, a thickness outside of these ranges can also be used. The electron injection layer can also include very thin insulative materials such as an oxide material or an alkaline metal compound as described in U.S. Pat. Nos. 5,457,565; 5,608,287 and 5,739,635, which are each incorporated herein by reference in their entirety.

A capping layer on the anode and/or cathode may also be included in order to increase the thermal stability, increase the environmental stability, and/or in some other way improve the performance of the organic light emitting device. An example of a capping layer that can be used to increase the thermal stability of the organic light emitting is a layer comprised of SiO, $SiO_2$, or mixtures thereof. Other examples are disclosed in U.S. Pat. Nos. 6,614,175 and 6,765,348, the disclosures of which are totally incorporated herein by reference. An example of a capping layer that can be used to increase the environmental stability of the organic light emitting device is a layer comprised of a stable metal such as Ag, Al, In, or Au. Another example of a capping layer that can be used to increase the environmental stability of the organic light emitting device is a layer comprised of a low work function metal as described for example in U.S. Pat. No. 5,059,861, the entire disclosure of which is incorporated herein by reference. The thickness of the capping layer can, for example, range from about 200 Angstroms to about 50,000 Angstroms. Typically, the thickness is from about 500 Angstroms to 5,000 Angstroms.

An optional buffer layer may be composed of a material with certain hole injection and transport properties and selected such that device performance is improved. Suitable materials that can be utilized in the buffer layer include semiconductive organic materials; such as, for example, porphyrin derivatives like 1,10,15,20-tetraphenyl21H,23H-porphyrin copper (II) disclosed in U.S. Pat. No. 4;356,429, incorporated herein by reference in its entirety; copper phthalocyanine, coppertetramethyl phthalocyanine; zinc phthalocyanine; titanium oxide phthalocyanine; magnesium phthalocyanine; and the like, and wherein copper phthalocyanine is one preferred example. Mixtures of these and other suitable materials can also be used. Other suitable materials that can be utilized in the buffer layer include semiconductive and insulative metal compounds, such as for example metal oxides like MgO, $Al_2O_3$, BeO, BaO, AgO, SrO, SiO, SiO2, $ZrO_2$, CaO, $Cs_2O$, $Rb_2O$, $Li_2O$, K2O and $Na_2O$; and metal halides, like LiF, KCl, NaCl, CsCl, CsF and KF. The buffer layer can have a thickness ranging from about 10 Angtroms to about 1,000 Angstroms. An illustrative thickness range for the buffer layer is from about 50 Angstroms to about 250 Angstroms. Another illustrative thickness range for the buffer layer is from about 10 Angstroms to about 50 Angstroms.

A class of hole transporting materials that can be selected for the buffer layer are the aromatic tertiary amines, such as those disclosed in U.S. Pat. No. 4,539,507, the disclosure of which is totally incorporated herein by reference. Representative examples of aromatic tertiary amines are bis(4-dimethylamino-2methylphenyl)phenylmethane; N,N,N-tri(p-tolyl)amine; 1,1-bis(4-di-p-tolylaminophenyl)cyclohexane; 1,1-bis(4-di-p-tolylaminophenyl)-4-phenylcyclohexane; N,N'-diphenyl-N,N'-bis(3-methylphenyl)-1,1'-biphenyl-4,4'-diamine; N,N'-diphenyl-N,N'bis(3-methylphenyl)-1,1'-biphenyl-4,4'-diamine; N,N'-diphenyl-N,N'-bis(4methoxyphenyl)-1,1'-biphenyl-4,4'-diamine; N,N,N',N'-tetra-p-tolyl-1,1'-biphenyl-4,4'-diamine; N,N'-di-1-naphthyl-N,N'-diphenyl-1,1'-biphenyl-4,4'-diamine; and the like. Another class of aromatic tertiary amines selected for the hole transporting layer is polynuclear aromatic amines, such as N,N-bis-[4'-(N-phenyl-N-m-tolylamino)-4biphenylyl]aniline; N,N-bis-[4'-(N-phenyl-N-m-tolylamino)-4-biphenylyl]-m-toluidine; N,Nbis-[4'-(N-phenyl-N-m-tolylamino)-4-biphenylyl]-p-toluidine; N,N-bis-[4'-(N-phenyl-N-ptolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(Nphenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene and the like.

A buffer layer comprised of one or more aromatic tertiary amines described above may further include, as disclosed in U.S. Pat. No. 5,846,666, the disclosure of which is fully incorporated herein by reference, a stabilizer comprised of certain hydrocarbon compounds, such as rubrene, 4,8-diphenylanthracene, and the like. The buffer layer can be prepared by forming a suitable compound into a thin film by known methods, such as vapor deposition or spin-coating. The thickness of buffer layer thus formed is not particularly limited, and can be in a range of, for example, from about 50 Angstroms to about 3,000 Angstroms, and, in some embodiments, from about 100 Angstroms to about 1,000 Angstroms.

In an exemplary embodiment of the present invention the organic luminescent material comprises the hole transporting layer of Formula I. In alternative embodiments, other suitable organic luminescent materials may be used, for example, polyphenylenevinylenes, such as poly(p-phenylenevinylene) PPV, poly(2-methoxy-5-(2-ethylhexyloxy) 1,4-phenylenevinylene) MEHPPV and poly(2,5-dialkoxy phenylenevinylene) PDMeOPV, and others as more generally disclosed in U.S. Pat. No. 5,247,190, the disclosure of which is totally incorporated herein by reference; polyphenylenes, such as poly(p-phenylene) PPP, ladder-poly-para-phenylene (LPPP), and poly(tetrahydropyrene) PTHP; and polyfluorenes, such as poly(9,9-di-n-octylfluorene-2,7-diyl), poly(2,8-(6,7,12, 12-tetraalkylindenofluorene) and copolymers containing fluorenes, such as fluorene-amine copolymers (e.g. Bernius et al. Proceedings of SPIE Conference on Organic Light Emitting Materials and Devices III, Denver, Colo., July 1999, Vol. 3797, p129).

Another class of organic materials with light emitting properties that can be utilized in the light emitting region includes, but is not limited to, the metal oxinoid compounds as disclosed in U.S. Pat. Nos. 4,539,507; 5,151,629; 5,150,006, 5,141,671, and 5,846,666, the disclosures of each of which are totally incorporated herein by reference. Illustrative examples include tris(8-hydroxyquinolinate) aluminum (Alq$_3$), which is one preferred example, and bis(8-hydroxyquinolato)-(4-phenylphenolato) aluminum (BAlq) which is another preferred example. Other examples of this class of materials include tris(8-hydroxyquinolinate) gallium, bis(8-hydroxyquinolate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxybenzo[h]quinolinate) beryllium, and the like, and metal thioxinoid compounds illustrated in U.S. Pat. No. 5,846,666, the disclosure of which is totally incorporated herein by reference, such as metal thioxinoid compounds of bis(8-quinolinethiolato)zinc, bis(8-quinolinethiolato)cadmium, tris(8-quinolinethiolato)gallium, tris(8-quinolinethiolato)indium, bis(5-methyl quinolinethiolato) zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Preferred materials are bis(8-quinolinethiolato)zinc, bis(8-quinolinethiolato)cadmium, tris(8-quinolinethiolato)gallium, tris(8-quinolinethiolato)indium and bis[benzo{f}-8-quinolinethiolato]zinc.

Furthermore, an additional class of organic materials with light emitting properties which can be selected for the light emitting region comprises stilbene derivatives, such as those disclosed in U.S. Pat. No. 5,516,577, the disclosure of which is totally incorporated herein by reference. A preferred stilbene derivative is 4,4'-bis(2,2-diphenylvinyl)biphenyl.

Yet, another class of suitable organic materials with light emitting properties suitable for utilizing in the light emitting region are the oxadiazole metal chelates disclosed in copending application U.S. Ser. No. 08/829,398, filed Mar. 31, 1997, the disclosure of which is totally incorporated herein by reference. These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato] beryllium; bis[5-biphenyl-2-(2-hydroxyphenyl)-1,3,4-oxadiazolato]zinc; bis[5-biphenyl-2-(2-hydroxyphenyl)-1,3, 4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato] beryllium; bis[5-(4-chlorophenyl)-2-(2-hydroxyphenyl)-1,3, 4-oxadiazolato]zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-.alpha.-(2-hydroxynaphthyl)-5-phenyl-1,3,4-oxadiazolato] zinc; bis[2-(2-hydroxyphenyl)-5-p-pyridyl-1,3,4-oxadiazolato]zinc; bis[2-(2-hydroxyphenyl)-5-p-pyridyl-1, 3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis [2-(2-hydroxyphenyl)-5-(1-naphthyl)-1,3,4-thiadiazolato] zinc; and bis[2-(2-hydroxyphenyl)-5-(1-naphthyl)-1,3,4-thiadiazolato]beryllium, and the like; the triazines as those disclosed in copending application U.S. Ser. No. 09/489,144 and U.S. Pat. No. 6,057,048, the disclosures of which are totally incorporated herein by reference. The light emitting region may further comprise one or more luminescent materials as dopants.

The light emitting region can further include from about 0.01 weight percent to about 25 weight percent of a luminescent material as a dopant. Examples of dopant materials that can be utilized in the light emitting region are fluorescent materials, such as, for example, coumarin, dicyanomethylene pyranes, polymethine, oxabenzanthrane, xanthene, pyrylium, carbostyl, perylene, and the like; another specially preferred class of fluorescent materials are quinacridone dyes. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethyl quinacridone, N,N'-dimethyl-2-chloroquinacridone, N,N'-dimethyl-2-fluoroquinacridone, N,N'-dimethyl-1,2-benzoquinacridone, and the like, and those disclosed in U.S. Pat. Nos. 5,227,252; 5,276,381 and 5,593,788, the disclosures of which are totally incorporated herein by reference. Also, a class of fluorescent materials that may be selected are fused ring fluorescent dyes. Examples of the fused ring fluorescent dyes include perylene, rubrene, anthracene, coronene, phenanthracene, pyrene and the like, as illustrated in U.S. Pat. No. 3,172,862, the disclosure of which is totally incorporated herein by reference. Also, fluorescent materials include butadienes, such as 1,4-diphenylbutadiene and tetraphenylbutadiene, stilbenes, and the like as illustrated in U.S. Pat. Nos. 4,356,429 and 5,516, 577, the disclosures of which are totally incorporated herein by reference. Other examples of fluorescent materials that can be used are those disclosed in U.S. Pat. No. 5,601,903, the disclosure of which is totally incorporated herein by reference.

The optional electron transporting layer selected for the primary purpose of improving the electron injection characteristics and the emission uniformity of electroluminescent devices in accordance with the present disclosure are of a suitable thickness, for example from about 10 Angstroms to about 3,000 Angstroms, or from about 50 Angstroms to about 1,000 Angstroms. Illustrative examples of electron transporting compounds, which can be utilized in this layer, include the metal chelates of 8hydroxyquinoline as disclosed in U.S. Pat. Nos. 4,539,507; 5,151,629, and 5,150,006, the disclosures of which are totally incorporated herein by reference. Illustrative examples include tris(8-hydroxyquinolinate)aluminum; tris(8-hydroxyquinolinate)gallium; bis(8-hydroxyquinolinate)magnesium; bis(8-hydroxyquinolinate)zinc; tris(5-methyl-8hydroxyquinolinate)aluminum; tris(7-propyl-8-quinolinolato)aluminum; bis[benzo{f}-8quinolinate] zinc; bis(10-hydroxybenzo[h]quinolinate)beryllium; and the like. Another class of metal chelate compounds suitable for the electron transport layer is the oxadiazole metal chelates disclosed in U.S. Pat. No. 5,925,472, the entire disclosure of which is incorporated herein by reference.

Another class of suitable electron transport materials comprises triazine compounds as disclosed in U.S. Pat. Nos. 6,057,048; 6,225,467; and 6,229,012, the disclosures of which are totally incorporated herein by reference. Illustrative specific examples include 4,4'-bis-[2-(4,6-diphenyl-1,3,5-triazinyl)]-1,1'-biphenyl; 4,4'-bis-[2-(4,6di-p-tolyl-1,3,5-triazinyl)]-1,1'-biphenyl; 4,4'-bis-[2-(4,6-di-m-tolyl-1,3,5-triazinyl)]-1,1'-biphenyl; 4,4'-bis-[2-(4,6-di-p-anisyl-1,3,5-triazinyl)]-1,1'-biphenyl; 4,4'-bis-[2-(4-(3naphthyl-6-phenyl-1,3,5-triazinyl)]-1,1'-biphenyl; 4,4'-bis-[2-(4,6-di-biphenylyl-1,3,5triazinyl)]-1,1'-biphenyl; 4,4'-bis-[2-(4,6-di-phenyl-1,3,5-triazinyl)]-2,2'-dimethyl-1,1'-biphenyl; 4,4'-bis-[2-(4,6-di-phenyl-1,3,5-triazinyl)]-stilbene; 4,4'-bis-[2-(4-phenyl-6-ptolyl-1,3,5-triazinyl)]-stilbene; 2,4,6-tri(4-biphenylyl)-1,3,5-triazine; and the like.

The hole transporting material of the present invention may comprise a bifunctional compound of Formula I. In one exemplary embodiment of the present invention the hole transporting region and a light emitting region may comprise the bifunctional compound of Formula I. In yet another embodiment of the present invention only one of the hole transporting region and light emitting region comprise the bifunctional compound of Formula I. In a further embodiment of the present invention only one region comprising the bifunctional compound of Formula I is formed instead of forming a hole transporting region and a light emitting region.

If the light emitting region is formed to comprise the bifunctional compound of Formula I, then an optional hole transporting region may also be formed of any other suitable material. Exemplary suitable materials to be used for a hole transporting region not comprising the bifunctional compound of Formula I are, for example, polypyrrole, polyaniline, poly(phenylene vinylene), polythiophene, polyarylamine as disclosed in U.S. Pat. No. 5,728,801, which is incorporated herein by reference in its entirety, and their derivatives, and known semiconductive organic materials; porphyrin derivatives such as 1,10,1 5,20-tetraphenyl-21H, 23H-porphyrin copper (II) disclosed in U.S. Pat. No. 4,356,429, incorporated herein by reference in its entirety; copper phthalocyanine, copper tetramethyl phthalocyanine; zinc phthalocyanine; titanium oxide phthalocyanine; magnesium phthalocyanine; and the like.

Another class of hole transporting materials not comprising the bifunctional compound of Formula I that can be utilized in the luminescent region are the aromatic tertiary amines such as those disclosed in U.S. Pat. No. 4,539,507, which is incorporated herein by reference in its entirety. Suitable exemplary aromatic tertiary amines include, but are not limited to, bis(4-dimethylamino2-methylphenyl) phenylmethane; N,N,N-tri(p-tolyl)amine, 1,1-bis(4-di-ptolylaminophenyl)cyclohexane; 1,1-bis(4-di-p-tolylaminophenyl)-4-phenylcyclohexane; N,N'-diphenyl-N,N'-bis(3-methylphenyl)-1,1'-biphenyl-4,4'-diamine; N,N'-diphenyl-N,N'bis(3-methylphenyl)-1,1'-biphenyl-4,4'-diamine; N,N'-diphenyl-N,N'-bis(4methoxyphenyl)-1,1'-biphenyl-4,4'-diamine; N,N,N',N'-tetra-p-tolyl-1,1'-biphenyl-4,4'-diamine; N,N'-di-1-naphthyl-N,N'-diphenyl-1,1'-biphenyl-4,4'-diamine; N,N'-bis(pbiphenyl)-N,N'-diphenyl benzidine(biphenyl TPD); mixtures thereof and the like. A preferred class of tertiary aromatic amines that can be used in the luminescent region are the naphtyl-substituted benzidine derivatives, such as, N,N'-di(naphthalene-1-yl)N,N'-diphenyl-benzidine (NPB). Another class of aromatic tertiary amines are polynuclear aromatic amines. Examples of these polynuclear aromatic amines include, but are not limited to, N,N-bis-[4'-(N-phenyl-N-m-tolylamino)-4-biphenylyl]aniline; N,Nbis-[4'-(N-phenyl-N-m-tolylamino)-4-biphenylyl]-m-toluidine; N,N-bis-[4'-(N-phenyl-N-mtolylamino)-4-biphenylyl]-p-toluidine; N,N-bis-[4'-(N-phenyl-N-p-tolylamino)-4biphenylyl]aniline; N,N-bis-[4'-(N-phenyl-N-p-tolylamino)-4-biphenylyl]-m-toluidine; N,Nbis-[4'-(N-phenyl-N-p-tolylamino)-4-biphenylyl]-p-toluidine; N,N-bis-[4'-(N-phenyl-N-pchlorophenylamino)-4-biphenylyl]-m-toluidine; N,N-bis-[4'-(N-phenyl-N-m . . . chlorophenylamino)-4-biphenylyl]-m-toluidine; N,N-bis-[4'-(N-phenyl-N-mchlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like; 4,4'-bis(9-carbazolyl)-1,1'-biphenyl compounds, such as 4,4'-bis(9-carbazolyl)-1,1'-biphenyl and 4,4'-bis(3-methyl-9-carbazolyl)-1,1'-biphenyl, and the like.

Additional non-bifunctional compounds for the hole transporting region may also include the indolo-carabazoles, such as those disclosed in U.S. Pat. Nos. 5,942,340 and 5,952,115, each incorporated herein by reference in its entirety, such as 5,11-di-naphthyl-5,11-dihydroindolo[3,2-b]carbazole, and 2,8-dimethyl-5,11-dinaphthyl-5,11-dihydroindolo[3,2-b]carbazole; N,N,N'N'-tetraarylbenzidines, wherein aryl may be selected from phenyl, m-tolyl, p-tolyl, m-methoxyphenyl, p-methoxyphenyl, 1 naphthyl, 2-naphthyl and the like. Illustrative examples of N,N,N'N'-tetraarylbenzidine are N,N-di-1-naphthyl-N,N'-diphenyl-1,1'-biphenyl-4,4'-diamine; N,N'-bis(3methylphenyl)-N,N'-diphenyl-1,1'-biphenyl-4,4'-diamine; N,N'-bis(3-methoxyphenyl)N,N'-diphenyl-1,1'-biphenyl-4,4'-diamine, and the like.

The thickness of the luminescent region can vary for example, from about 10 A to about 10,000 A, typically from about 200 A to about 2,000 A, and particularly from about 500 A to about 1,500 A. In embodiments wherein the luminescent region includes two or more layers, the thickness of each layer can, for example, be from about 10 A to about 5,000 A, typically from about 50 A to about 2,000 A, and particularly from about 100 A to about 1,500 A. Each layer of the OLED may have a generally uniform or non-uniform composition across the layer thickness where each layer is composed entirely of one material or a mixture of materials. It will be appreciated that a display device in accordance with the present disclosure may also include one or more light-absorbing layers in any of the cathode, anode, and luminescent regions, or outside of the anode or cathode. Examples of suitable light-absorbing layers including, but not limited to layers comprising metal-organic mixed layers as described in, for example, U.S. Patent Application Publication Nos. 2002/0180349 and 2003/0234609, the entire disclosures of which are incorporated herein by reference, and the light-absorbing layers of copending application [20031599US-NP], the entire disclosure of which is incorporated herein by reference.

OLEDs according to the present invention may be fabricated by sequentially forming the desired layers on the substrate using any suitable thin film forming technique, typically, spin coating or deposition by thermal evaporation in vacuum. More details about fabrication and operation of organic light emitting devices are disclosed, for example, in U.S. Pat. Nos. 4,539,507; 4,769,292; 6,392,339; 6,392,250; and 6,614,175, the disclosure of each patent and patent application being totally incorporated herein by reference.

An organic light emitting device in accordance with the present disclosure can demonstrate an improved performance, such as, a higher operational stability and improved color purity, compared to other light emitting devices, such as, for example, OLEDs.

Figure 4:
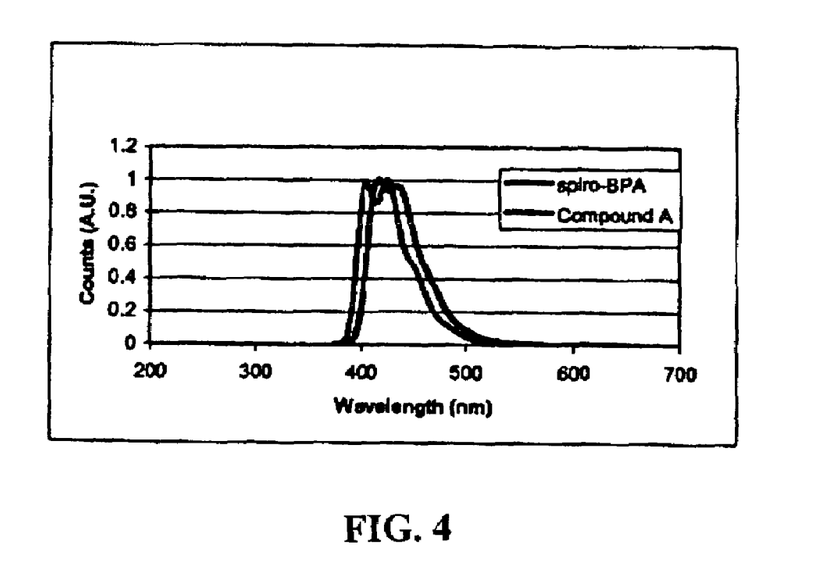
FIG. 4 shows fluorescence spectra data of an exemplary compound according to the present invention.
Figure 5:
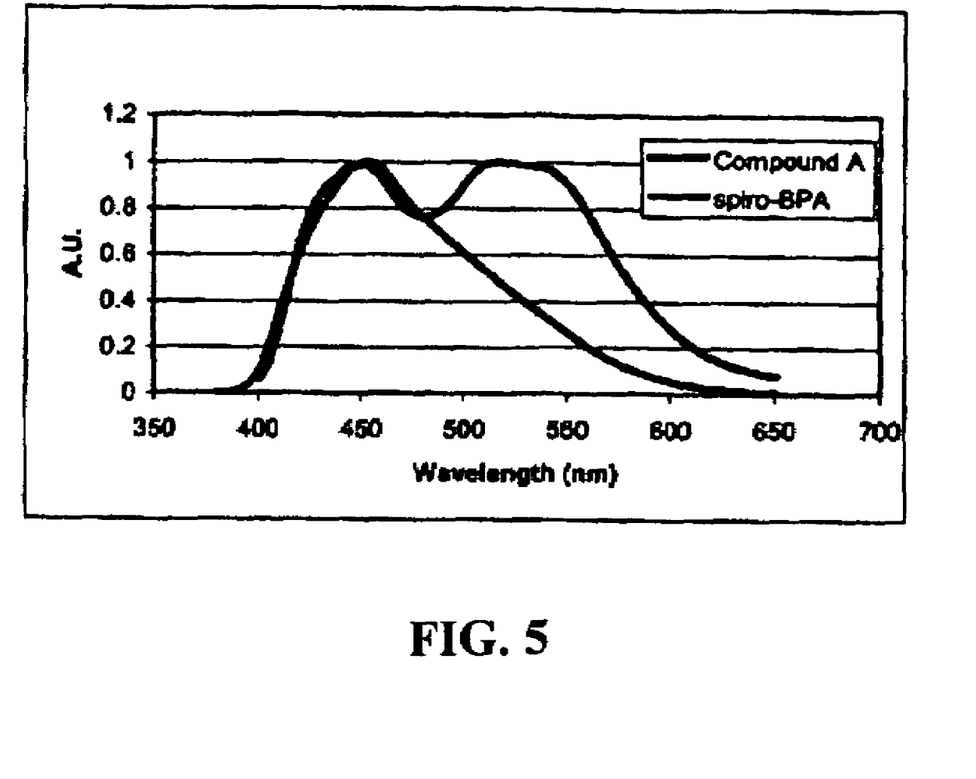
FIG. 5 shows electroluminescent spectra of an exemplary compound according to the present invention.

As shown in FIG. 4 the fluorescence of exemplary Compound A, as synthesized above, was tested in solution and compared to the fluorescence of spiro-biphenylanthracene (spiro-BPA) tested in the same manner. It was found that similar fluorescence spectra were produced, both compounds showing strong fluorescence in the blue region. Compound A was also tested in a multilayer OLED device. These compounds looked to be very promising blue emitters. However, Compound A was found to produce an absorbace both in the blue and green wavelengths whereas the spiro-BPA compound has an absorbance only in the blue region with a tailing in the green region as shown in FIG. 5, the shifting of the electorluminescence to a longer wavelength (red shift) of Compound A when in the solid state is likely due to pi stacking (or molecular aggregation) of the molecules.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent device comprising:
an anode,
a cathode, and
a compound of Formula I:

Formula I wherein at least one R1-R8 is an electron transport group selected from the group consisting of triazine, oxadiazole, triazole, imidazole, oxazole, thiazole, thiadiazole, benzothiadiazole, pyridine, quinoline, quinoxaline, anthrazoline, phenanthroline, imidazole, pyrazole, and indane; and
wherein the R1-R8 that are not an electron transport group are each a substituent independently selected from the group consisting of hydrogen, alkyl with from 1 to 25 carbon atoms, an alicyclic alkyl group with from about 3 to 15 carbon atoms, an alkoxy group with from 1 to 25 carbon atoms, a dialkylamino group with from 2 to 25 carbon atoms, a halogen, cyclohexyl, substituted or unsubstituted aryl, heteroaryl, biphenylyl, phenylvinyl, and diphenylvinyl.

2. The electroluminescent device of claim 1, wherein R1 is an electron transport group.

3. The electroluminescent device of claim 1, wherein R4 is an electron transport group.

4. The electroluminescent device of claim 1, wherein R6 is an electron transport group.

5. The electroluminescent device of claim 1, wherein R7 is an electron transport group.

6. The electroluminescent device of claim 1, wherein R1 and R4 are electron transport groups.

7. The electroluminescent device of claim 1, wherein R6 and R7 are electron transport groups.

8. The electroluminescent device of claim 1, further comprising:
a hole transporting region;
an electron transporting region.

9. The electroluminescent device of claim 8, wherein the hole transporting region comprises the compound of Formula I.

10. The electroluminescent device of claim 8, further comprising:
a light emitting region.

11. The electroluminescent device of claim 10, wherein the hole transporting region comprises the compound of Formula I.

12. The electroluminescent device of claim 10, wherein the light emitting region comprises the compound of Formula I.

13. The electroluminescent device of claim 10, wherein the hole transporting region and the light emitting region comprise the compound of Formula I.

14. The electroluminescent device of claim 13, wherein the hole transporting region and the light emitting region are two separate regions.

15. The electroluminescent device of claim 1, further comprising a cap layer.

16. The electroluminescent device of claim 1, wherein the R1-R8 that are not an electron transport group are each a substituent independently selected from methyl, ethyl, isopropyl, tert-butyl, 4-tert-butylcyclohexyl, methoxy, ethoxy, isopropoxy, tert-butoxy, dimethylamino, diethylamino, phenyl, tolyl, naphthyl, anthryl, phenylanthryl, diphenylanthryl, and chlorine.

17. An organic electroluminescent device comprising:
an anode,
a cathode, and
a compound of Formula I:

Formula I wherein at least one R2-R3, R5, and R8 is an electron transport group and wherein R1, R4, and the R2-R3 and R5-R8 that are not an electron transport group are each a substituent independently selected from the group consisting of hydrogen, alkyl with from 1 to 25 carbon atoms, an alicyclic alkyl group with from about 3 to 15 carbon atoms, an alkoxy group with from 1 to 25 carbon atoms, a dialkylamino group with from 2 to 25 carbon atoms, a halogen, cyclohexyl, substituted or unsubstituted aryl, heteroaryl, biphenylyl, phenylvinyl, and diphenylvinyl.

18. The electroluminescent device of claim 17, wherein the electron transport group is a fluorophenyl.

* * * * *